United States Patent [19]

Hirao et al.

[11] Patent Number: 5,077,613
[45] Date of Patent: Dec. 31, 1991

[54] VIDEO CAMERA WITH AUTOMATIC FOCUSING FUNCTION

[75] Inventors: Yoshiaki Hirao, Habikino; Ryuichiro Kuga, Katano; Masayuki Yoneyama, Takatsuki, all of Japan

[73] Assignee: Matsushita Electric Industrial Co., Ltd., Osaka, Japan

[21] Appl. No.: 472,291

[22] Filed: Jan. 30, 1990

[30] Foreign Application Priority Data

Jan. 30, 1989 [JP] Japan .................................. 1-20002

[51] Int. Cl.⁵ .......................................... H04N 5/232
[52] U.S. Cl. .................................... 358/227; 354/402
[58] Field of Search ................ 358/227; 354/400, 402, 354/404

[56] References Cited

U.S. PATENT DOCUMENTS

| | | | |
|---|---|---|---|
| 3,896,304 | 7/1975 | Aoki et al. | 354/404 |
| 3,896,457 | 7/1975 | Yamamishi et al. | 354/404 |
| 4,045,805 | 8/1977 | Saito | 354/404 |
| 4,484,806 | 11/1984 | Onishi et al. | 358/227 |
| 4,638,364 | 1/1987 | Hiramatsu | 358/227 |
| 4,717,959 | 1/1988 | Isago | 358/227 |
| 4,842,387 | 6/1989 | Murakami et al. | 354/404 |
| 4,872,058 | 10/1989 | Baba et al. | 358/227 |
| 4,903,135 | 2/1990 | Ohtake et al. | 354/402 |
| 4,959,726 | 9/1990 | Miida et al. | 358/227 |

Primary Examiner—James J. Groody
Assistant Examiner—Glenton B. Burgess
Attorney, Agent, or Firm—Wenderoth, Lind & Ponack

[57] ABSTRACT

A video camera with an automatic focusing device includes a pre-process unit for eliminating a direct current component from a signal of the video camera and controlling the obtained signal so that the amplitude thereof can be at a constant level, which is disposed at the preceding stage of a signal processing unit for operating the focusing condition of an object from the signal of the video camera. An amplitude of a video signal to be inputted to the signal processing unit can be largely suppressed, thus providing a largely simplified circuit structure of a signal processing unit.

6 Claims, 7 Drawing Sheets

FIG. 10

VIDEO CAMERA WITH AUTOMATIC FOCUSING FUNCTION

BACKGROUND OF THE INVENTION

1. Field of the Invention

This invention relates to a video camera having an automatic focusing function.

2. Description of the Prior Art

Previously, a method which uses a high frequency component of a video signal generated in a video camera (hereinafter called a "video signal system") has been well-known as an automatic focusing apparatus (auto-focus system) for use in video cameras. This system is one of the most effective systems in that no generation of parallax results theoretically and the focusing can be achieved with high accuracy.

For example, an auto-focus system disclosed in U.S. Pat. Application Ser. No. 272, 898 filed on Nov. 18, 1899 is equipped with a frequency filter for extracting frequency components of horizontal and vertical directions of an image plane to switch the characteristic of the frequency filter according to an information of an object, thus being capable of achieving the focusing operation highly definitely.

An auto-focus system for use in video cameras is required to execute operations always at a high level of accuracy in response to various types of objects with a wide range of illuminance and contrast properties. That is, a signal processing unit in the auto-focus system is required to have a wide dynamic range. In order to construct the signal processing unit with a digital circuit, it is required that the number of bits of an Analog-Digital Converter (hereinafter called an A/D Converter) to be placed at the initial stage of the signal processing unit is made large and the number of bits of a signal processing circuit to be successively placed thereto is made equal to or larger than that of the A/D Converter. This makes the structure of the signal processing unit extremely complex.

SUMMARY OF THE INVENTION

An object of this invention is to provide a video camera which is simple in structure and automatically focusable always at a high level of accuracy under various conditions of an object.

In order to attain the above-mentioned object, a video camera with automatic focusing function of this invention comprises a taking lens including a focusing lens for forming an image of an object, a photo-electric converter for converting the image formed through the taking lens into an electrical signal, a pre-process unit for eliminating a direct current component from an output signal of the photo-electric converter to control it so as to maintain the amplitude thereof at a constant level, a signal processing unit for extracting a high frequency component having a frequency higher than a specific frequency from an output signal of the pre-process unit so as to thereby generate a focus signal corresponding to the amplitude level of the high frequency component thus extracted, a lens driving unit for driving the focusing lens of the taking lens, and a control unit for controlling the lens driving unit according to the focus signal so as to thereby effect the focusing.

With the above-mentioned structure, an output signal of the photo-electric converter is not inputted directly to the signal processing unit, but is inputted first to the preprocess unit to eliminate frequency components which are unnecessary for detecting the focusing condition of an object from the output signal of the photo-electric converter. Then, the signal thus obtained is subjected to either amplification or compression through a gain control unit thereby maintaining the signal amplitude at a constant level.

Thus, the signal level range of a video signal inputted to the signal processing unit is effectively and largely suppressed, being capable of making the signal processing unit simple in structure.

DESCRIPTION OF THE PREFERRED EMBODIMENTS

Figure 1:
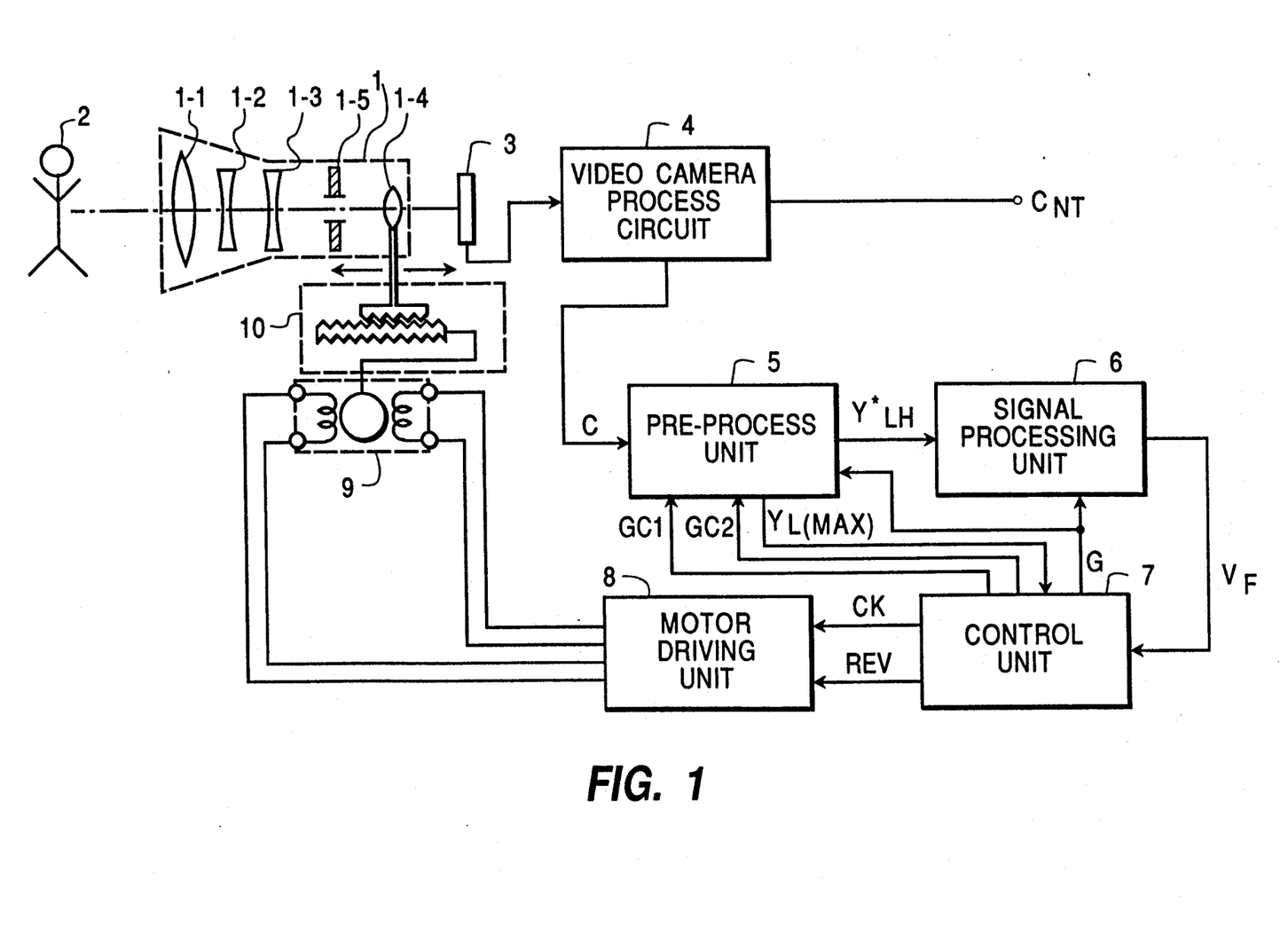
FIG. 1 is a block diagram showing a video camera according to an embodiment of this invention.

In FIG. 1, the reference numeral 1 indicates a zoom lens. The zoom lens 1 consists, sequentially from the object side, of a first lens group 1-1 having a positive refractive power, a second lens group 1-2 having a negative refractive power and an image magnification varying function, a third lens group 1-3 having a refractive power approximately canceling the synthetic refractive power of the first lens group 1-1 and the second lens group 1-2, a fourth lens group 1-4 having a positive refractive power and an image-forming function, (each lens group is indicated by one piece of either convex or concave lens for the sake of convenience, but it may practically comprise a plurality of convex lenses or a plurality of concave lenses), and an iris 1-5. In this embodiment, the fourth lens group 1-4 constitutes a focusing lens.

An image of an object 2 is inputted through the zoom lens 1 into a Charge-Coupled Device (CCD) 3 which is a photo-electric converter. A video camera process circuit 4 drives the CCD 3 as well as executing various signal processing that are well-known for an electrical signal obtained from the CCD 3 to output a specified video signal (for example, an NTSC signal) $C_{NT}$.

An automatic focusing apparatus comprises a pre-process unit 5, a signal processing unit 6, a control unit 7, a motor driving unit 8, a stepping motor 9 and a lens driving mechanism 10.

The pre-process unit 5 eliminates frequency components which are unnecessary to detect the focusing information of an object from a video signal C outputted from the video camera process circuit 4 and including at least a luminance signal as well as executing either amplification or compression so that the output signal therefrom can be at a constant level.

The signal processing unit 6 extracts frequency components having a frequency exceeding a specific frequency (called high frequency component) from an output signal $Y^*_{LH}$ of the pre-process unit 5 in a specific range of an image plane (called a signal extracting range) of the automatic focusing range, and detects and outputs its peak value (called a focus voltage $V_F$).

The control unit 7 holds focus voltages $V_F$ for two fields and calculates the difference $\Delta V_F$ between the focus voltage in the present field and that in the preceding field. Then, from the sign and absolute value of this difference $\Delta V_F$, it discriminates the focusing condition of the zoom lens 1, generates a clock signal CK and a normal or reverse rotation signal REV which respectively define the driving speed and rotational direction of the stepping motor 9, and supplies the signals thus generated to the motor driving unit 8.

The clock signal CK consists concretely of a binary pulse train. In this case, the number of pulses per unit time of CK is proportional to the driving speed of the stepping motor 9. The normal or reverse rotation signal REV is a binary signal, and for example, if REV is "0", clockwise rotation is indicated and on the other hand, if it is "1", counterclockwise rotation is indicated.

The motor driving unit 8 drives the stepping motor 9 according to the clock signal CK and the normal or reverse rotation signal REV. The stepping motor 9 moves through the lens driving mechanism 10 the fourth lens group 1-4 of the zoom lens 1 to a predetermined position, thus effecting the focusing automatically.

The control unit 7 has second and third functions additionally to the above-mentioned focusing control function as follows:

The second function thereof is to generate a gate signal G defining the signal extracting range to be set at a specific area of an image plane and to supply it to the pre-process unit 5 and the signal processing unit 6 (signal extracting region defining function).

The third function thereof is to generate gain control signals GC1 and GC2 for use in controlling the signal level to be executed in the pre-process unit 5 and to supply them to the pre-process unit 5 for this purpose (gain control signal generating function).

The control unit 7 having functions as shown above can be easily practically realized using a microcomputer in general. Hereinafter, the functions of the control unit 7 will be described in detail from this standpoint of view.

Figure 2:
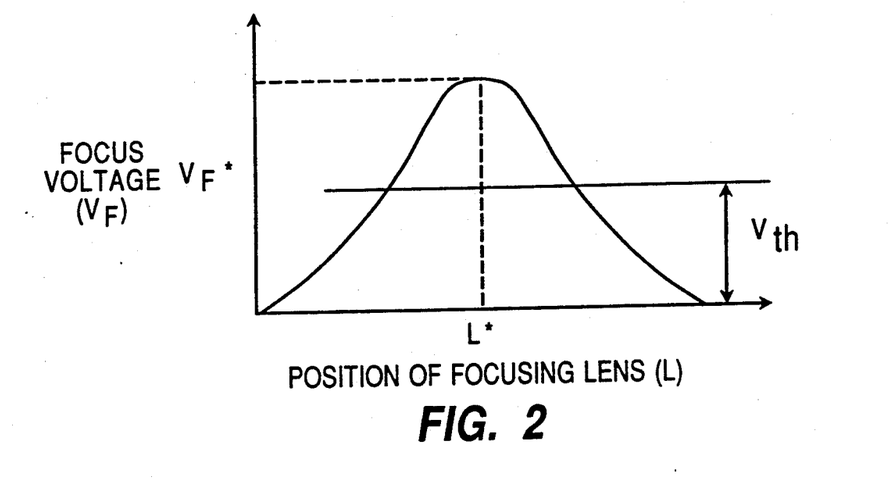
FIG. 2 is a curve showing the relationship of the position of a focusing lens and a focus voltage.
Figure 3:
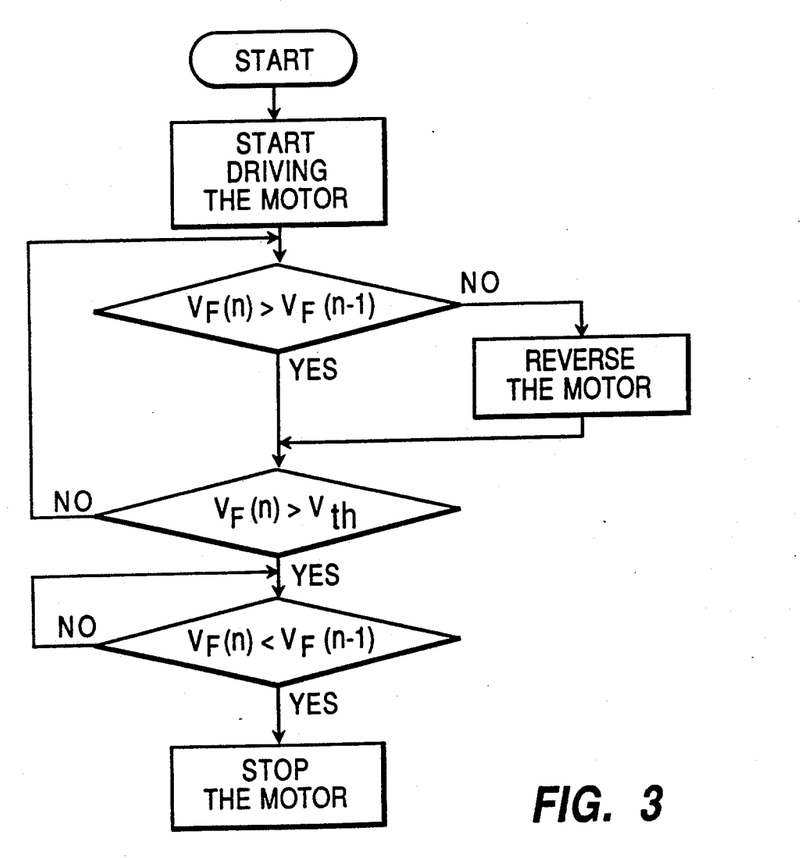
FIG. 3 is a flowchart showing the operation of a control unit which is a component of a video camera according to an embodiment of this invention.

First, the operation of the focusing control will be concretely explained while referring to FIGS. 2 and 3

FIG. 2 shows the relationship of the focus voltage $V_F$ versus the change in the position of focusing lens. The abscissa is the position of the focusing lens (L) of the zoom lens 1 and the ordinate is the focus voltage $(V_F)$. The focus voltage $(V_F)$ has the maximum value $(V_F^*)$ at a focused position $(L^*)$, and as it is out of focus, the level of the focus voltage is lowered, showing a cone-shaped curve as the whole.

FIG. 3 is a flowchart showing the focusing control operation of the control unit 7 practically realizable by using a microcomputer.

In FIG. 3, $V_F(n)$ and $V_F(n-1)$ are focus voltage values of n—th field and (n—1)—th field, respectively. When the focusing operation is started, first, the stepping motor 9 is rotated in any direction (for example, the above-mentioned REV is set to "0" to rotate it clockwise). Then, a comparison is executed between $V_F(n)$ and $V_F(n-1)$. If $V_F(n) > V_F(n-1)$, it indicates the ascending condition in the cone-shaped curve shown in FIG. 2, continuing the stepping motor 9 to rotate in the present rotational direction (the REV is held at "0" to rotate the motor clockwise continuously). If $V_F(n) \leq V_F(n-1)$, the stepping motor 9 is reversely rotated (the above-mentioned REV is set to "1" to rotate the stepping motor 9 counterclockwise).

Next, the comparison of $V_F(n)$ with a pre-determined level $V_{th}$ is carried out. If $V_F(n) > V_{th}$, it means that $V_F$ approaches the summit (i.e., the focused point) of the curve shown in FIG. 2. And if $V_F(n) < V_F(n-1)$, it means that the focused point has been passed, causing the stepping motor 9 to stop.

Also, the driving speed of the stepping motor 9 is selected from various kinds of speeds specified in advance in accordance with the value of $|V_F(n) - V_F(n-1)|$. If the value of $|V_F(n) - V_F(n-1)|$ is large, it can be considered that the focus of a camera is largely off the focused point (corresponding to the base area of the cone-shaped curve of FIG. 2), so that the driving speed thereof is set to a large value (namely, the number of pulses per unit time of the above-mentioned CK is large). If the value of $|V_F(n) - V_F(n-1)|$ is small, the focus of a camera is near the focused point (corresponding to the neighborhood of the summit of the curve shown in FIG. 2), so that the driving speed thereof is set to a small value (namely, the number of pulses per unit time of the CK is small).

Figure 4:
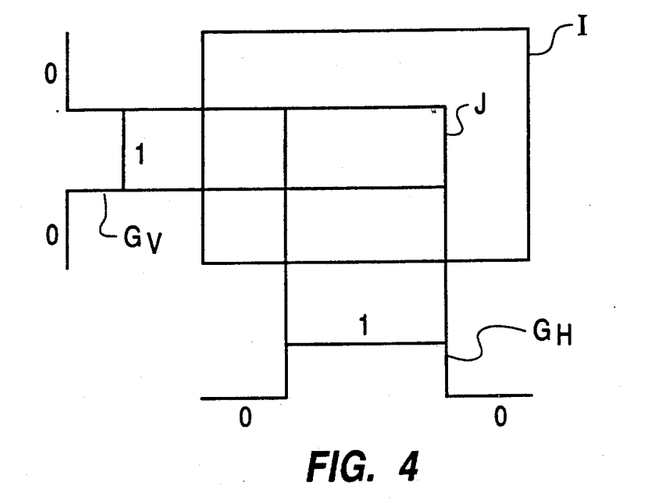
FIG. 4 is a schematic diagram for explaining the timing of a gate signal generated by a control unit which is a component of a video camera according to an embodiment of this invention.

Next, the signal extracting range defining function of the control unit 7 will be explained below while referring to FIG. 4. In FIG. 4, alphabetic letter I indicates a range (image plane) to be taken by a video camera. The automatic focusing is executed generally using a video signal within the signal extracting range which is set in a rectangular form at the central area of the image plane (an area indicated at J in FIG. 4). In this case, the control unit 7 generates a gate signal G $(G = G_H \cap G_V)$ expressed by the logical product of binary signals $G_H$ and $G_V$ which give gate timings of the horizontal and vertical directions in the signal extracting range J, respectively, and outputs it.

Figure 5A:
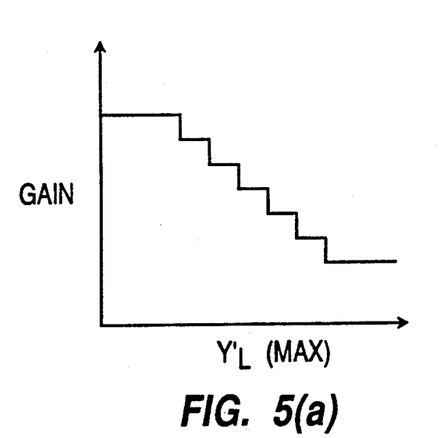
FIGS. 5(a) and 5(b) are is curves showing the gain control by two gain control signals generated by a control unit which is a component of a video camera according to an embodiment of this invention.

The gain control signal generating function of the control unit 7 will be explained while referring to FIGS. 5(a) and 5(b)

Gain control signals GC1 and GC2 both are for maintaining the level of a video signal to be controlled at a constant valve as much as possible. For this, the control unit 7 generates, as shown in FIG. 5 (a), a gain control signal GC1 for indicating such a gain that becomes small as the level of the maximum value $Y'_L(max)$ of a video signal which is a gain control signal between unit fields becomes large to the pre-process unit 5, and outputs it.

Basically, the gain that GC1 indicates can be set such as to be inversely proportional to $Y'_L(max)$, but in this embodiment, for the convenience when a microcomputer is used, the gain is set such as to be reduced discretely in a corresponding relationship to the level of $Y'_L(max)$.

Figure 5B:
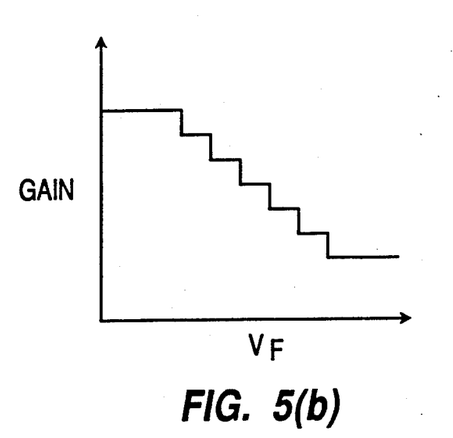

Similarly, the control unit 7 generates, as shown in FIG. 5 (b), a gain control signal GC2 for indicating such a gain that becomes small as the level of the focus signal $V_F$ which is a gain control signal becomes high, and outputs it. In this case, for the convenience of using a microcomputer, the gain is set such as to be reduced discretely in a corresponding relationship to the level of $V_F$.

Figure 6:
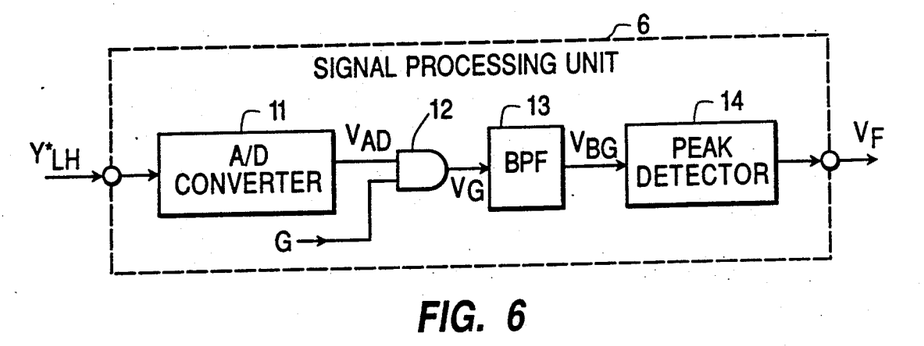
FIG. 6 is a block diagram showing a concrete structure of a signal processing unit which is a component of a video camera according to an embodiment of this invention.

The concrete structure and functions of the signal processing unit 6 will be explained below while referring to FIG. 6. The signal processing unit 6 comprises, as shown in FIG. 6, an Analog-Digital Converter (A/D Converter) 11, a gate circuit 12, a band pass filter (BPF) 13 and a peak detector 14. The A/D Converter 11 converts an analog video signal $Y^*_{LH}$ outputted from the pre-process unit 5 into a digital signal $V_{AD}$. The digital signal $V_{AD}$ and a gate signal G outputted from the control unit 7 are inputted to the gate circuit 12 to obtain their logical product, thereby extracting only a signal $V_G$ in a signal extracting range defined by the gate signal G. The BPF 13 extracts and amplifies only a high frequency component of a specific frequency band (for example, from 1 MHz to 2 MHz) from the digital video signal $V_G$ outputted from the gate circuit 12, and outputs it as an output signal $V_{BG}$. The peak detector 14 detects the maximum value of the signal $V_{BG}$ and outputs it as a focus voltage $V_F$.

Figure 7:
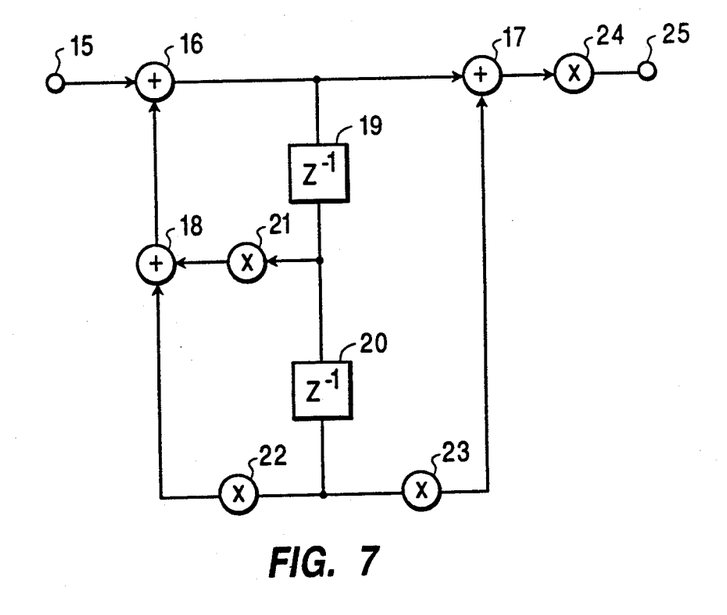
FIG. 7 shows a circuit of BPF in a signal processing unit which is a component of a video camera according to an embodiment of this invention.
Figure 8:
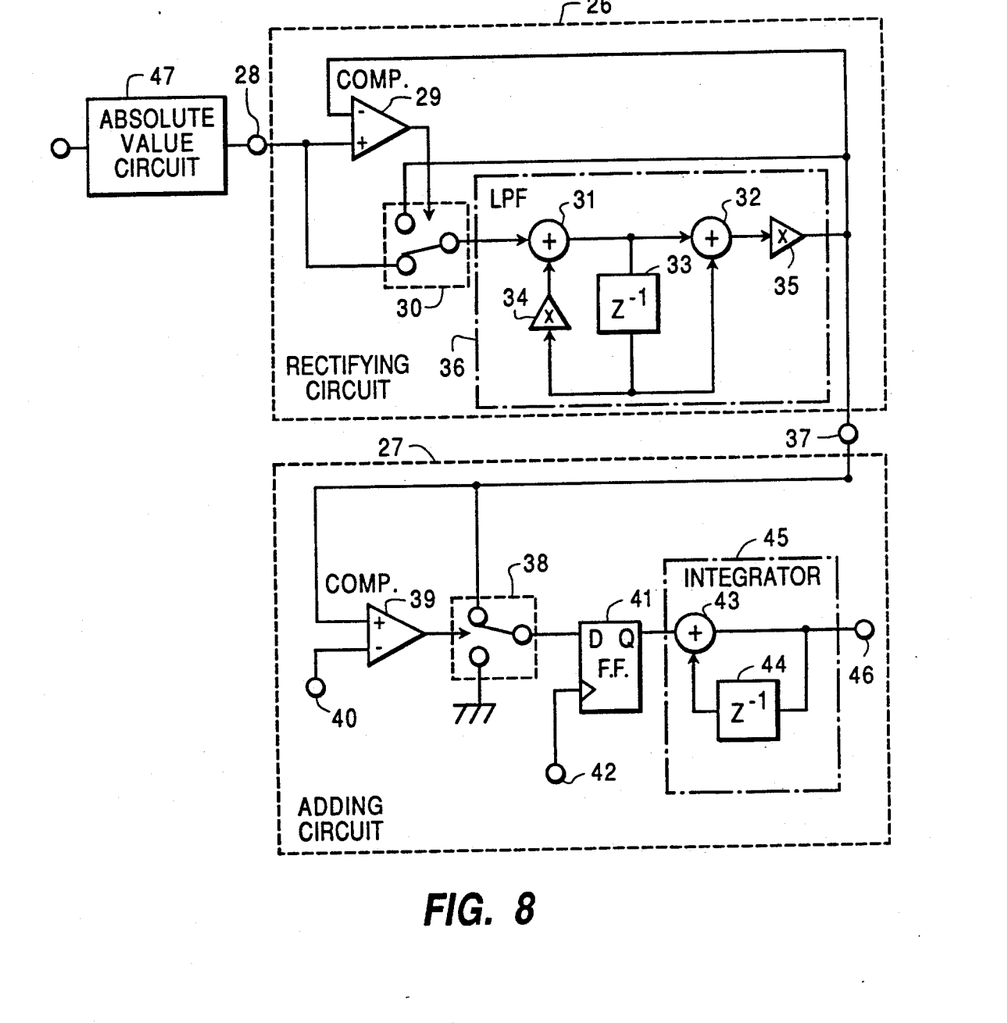
FIG. 8 shows a circuit of a peak detector in a signal processing unit which is a component of a video camera according to an embodiment of this invention.

Concrete structures of the BPF 13 and peak detector 14 to be used in this embodiment are shown in FIGS. 7 and 8, respectively.

FIG. 7 shows a BPF circuit which is a duplex secondary digital BPF. In FIG. 7, reference numerals 15 and 25 indicate an input terminal and an output terminal, respectively. Each of elements 16, 17 and 18 is an adder. Each of elements 21, 22, 23 and 24 is a multiplier for multiplying a constant coefficient thereto. Elements 19 and 20 respectively are unit clock delay elements.

FIG. 8 is a circuit of the peak detector 14. In FIG. 8, element 26 is a rectifying circuit and element 27 is an adding circuit. Element 28 is an input terminal to the rectifying circuit 26 and a signal therefrom is supplied to a comparator 29 and a switching circuit 30. Elements 31 and 32 are adders, element 33 is a unit clock delay element, and elements 34 and 35 respectively are multipliers for multiplying a pre-determined coefficient thereto, constituting a low-pass filter (LPF) 36 as the whole. An output signal from the multiplier 35 is connected to the comparator 29 and another input terminal of the switching circuit 30. The switching circuit 30 switches the input to the adder 31 by the output from the comparator 29.

The output signal of the rectifying circuit 26 is inputted through the terminal 37 into the adding circuit 27 and connected to the switching circuit 38 and the comparator 39. The reference numeral 40 indicates an input terminal of a signal at a pre-determined level. Data supplied to the input terminal 40 is compared by the comparator 39 with an output signal of the rectifying circuit 26 to control the switching circuit 38. A D-flip-flop is indicated at 41. Actually, a plurality of D-flip-flops are provided corresponding to the number of bits of a signal. The D-flip-flop 41 holds an output data of the switching circuit 38 at a timing determined by a horizontal synchronizing signal of a video signal inputted to the terminal 42. Element 43 is an adder and 44 is a unit clock delay element, which forms a so-called recursive circuit that allows the output to be fed back to the input, constituting an integrator 45. A clock signal supplied to the unit clock delay element 44 is synchronized to the horizontal synchronizing signal. Element 46 is a terminal.

The operation of the peak detector structured as above will be explained below. The absolute value of input signal $V_{BG}$ of the peak detector 14 is taken by an absolute value circuit 47 and inputted to the input terminal 28 of the rectifying circuit 26. Since the switching circuit 30 is connected to the terminal of the side of the input terminal 28, the signal is fed to the LPF 36. The output from the LPF 36 is compared by the comparator 29 with the input signal. If the output signal is larger, the switching circuit 30 is connected to the output side of the LPF 36, thus, the output of the LPF 36 is held. This operation is continued during the horizontal scanning period of the video signal. As a result, a peak value in unit line of the video signal subjected to band limitation by the LPF 36 can be held. Unlike a simple peak holding circuit, noise components of a high frequency wave can be eliminated. The rectifying circuit 26 is reset by the above-mentioned horizontal synchronizing signal, and then, in the next line, the operation is newly started.

The peak value in a unit line of the video signal held in such a way as shown above is sent to the adding circuit 27. To the input terminal 40 of the comparator 39 is inputted a signal having a value equivalent to the output level of the rectifying circuit 26 when noise components only are inputted (hereinafter called a noise level). The input signal of the adding circuit 27 is, using the comparator 39 and switching circuit 38 and the D-flip-flop 41 when it is below the noise level, integrated by a unit line by the integrator 45 and the integrated value in the period of unit field is outputted from the output terminal 46. The adding circuit 27 is reset by the vertical synchronizing signal of the video signal and, in the next field, the operation is newly started.

With the peak detector 14 structured as above, an added value of peak values in respective unit lines of the video signal in the above-mentioned signal extracting range is outputted as the focus signal $V_F$.

Figure 9:
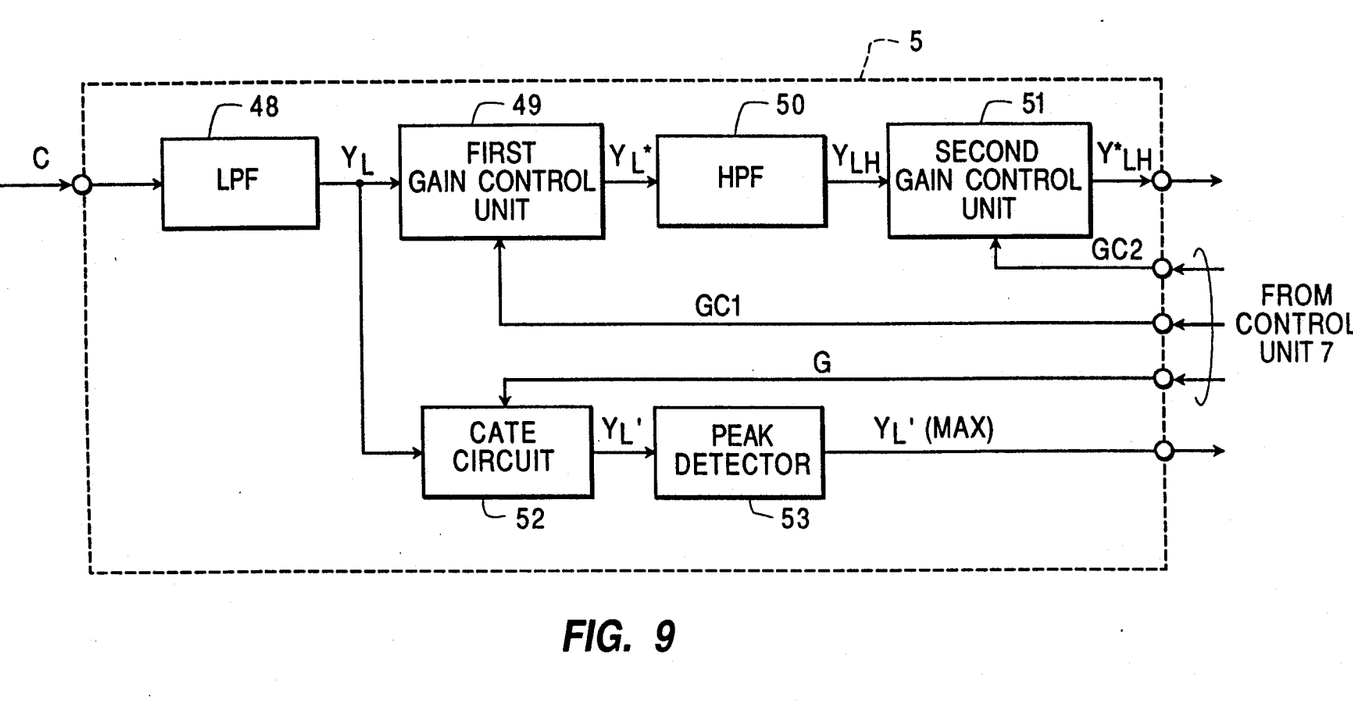
FIG. 9 is a block diagram showing a first concrete structure of a pre-process unit which is a component of a video camera according to an embodiment of this invention.

An example showing the concrete structure of the pre-process unit is shown in FIG. 9. The structure and functions of the pre-process unit which is a key component of a video camera according to this invention will be explained in detail while referring to FIGS. 1 and 9.

Video signal C outputted from the video camera process circuit 4 is first inputted to a low pass filter (LPF) 48 in which unnecessary high frequency components are eliminated. After the high frequency component elimination, the signal is outputted as a signal $Y_L$ therefrom. With the automatic focusing unit of this invention, the frequency band necessary for detecting a focusing information of an object is defined as to be from 0.1 to 4 MHz, preferably from 0.3 to 3 MHz, a frequency band other than this is unnecessary. As a result, unnecessary high frequency components are a signal component having a frequency higher than 3 MHz including a fundamental clock or the like of a video camera. From this point of view, the cutoff frequency $f_{Lc}$ of the LPF 48 is set at a frequency of 3 MHz. Luminance information of an object is concentrated mainly at a low band area of a video signal, so that such an information will be included into the video signal $Y_L$ passed through the LPF 48.

The video signal $Y_L$ thus passed through the LPF 48 is controlled by a first gain control unit 49 so that the output level thereof can be made constant. The signal thus controlled is sent to a high-pass filter (HPF) 50 as an output signal $Y^*_L$. The cutoff frequency of the HPF 50 is set at a frequency of 0.3 MHz for the above-mentioned reason. The luminance signal $Y_{LH}$ passed through the HPF 50 is being subjected to the elimination of direct current component or low frequency component unnecessary for detecting the focusing information, including the information corresponding to the contrast of an object. The video signal $Y_{LH}$ thus passed through the HPF 50 is controlled by a second gain control unit 51 so that the level of the output signal thereof (i.e., output signal of the pre-process unit 5) can be made constant. The signal thus controlled is outputted as an output signal $Y^*_{LH}$.

Next, how the gain control is achieved through the first and second gain control units 49 and 51 will be explained below.

The first gain control unit 49 is for maintaining the output signal of the LPF 48 at a constant level. This is performed in such a way that the maximum value of output signal of the LPF 48 is detected through a gate circuit 52 and a peak detector 53, and the first gain control unit 49 amplifies or compresses the output signal of the LPF 48 based on this detection so as to thereby function to make the amplitude value thereof constant.

The operation during this will be explained further in detail. The gate circuit 52 extracts only a video signal $Y'_L$ in the signal extracting range to be set by a gate signal G outputted from the control unit 7 from the output signal $Y_L$ of the LPF 48 and outputs it. The peak detector 53 holds the maximum value $Y'_L(\text{max})$ between unit fields of the video signal $Y'_L$ passed through the gate circuit 52. The control unit 7 generates, based on the process already explained above, a first gain control signal GC1 from the maximum value $Y'_L(\text{max})$ thus held to supply it to the first gain control unit 49. The first gain control unit 49 consists of a well-known differential amplifier. To one input terminal of the differential amplifier is inputted the output signal $Y_L$ of the LPF 48 to be gain-controlled and to the other input terminal thereof is inputted the first gain control signal GC1 (a direct current voltage at least in a unit field period), in which control is executed to make constant the amplitude level of the output signal $Y_L$ of the LPF 48 so as to thereby output it as an output signal $Y^*_L$.

In addition, the control unit 7 generates, based on the process already explained above, a second gain control signal GC2 from the focus voltage $V_F$ detected by the signal processing unit 6 to supply it to the second gain control unit 51. The second gain control unit 51 consists of a differential amplifier similar to the case of the first gain control unit 49. The output signal $Y_{LH}$ of the HPF 50 to be gain-controlled is inputted to one input terminal of the differential amplifier and the second gain control signal GC2 (a direct current voltage at least in a unit field period) is inputted to the other input terminal thereof, in which control is executed to make constant the amplitude level of the output signal $Y_{LH}$ of the HPF 50 so as to thereby output it as the output signal $Y^*_{LH}$.

As explained above, the first gain control unit 49 serves to mainly suppress the variations in the luminance level accompanied with the change in the luminance of an object to generate a luminance signal $Y^*_L$ regulated at a constant level. On the other hand, the second gain control unit 51 serves to suppress the variations in the high frequency component level of a luminance signal corresponding to the change in the contrast of an object to generate a video signal $Y^*_{LH}$ a constant level. The video signal $Y^*_{LH}$ thus generated is sent to the signal processing unit 6 of the next stage.

Figure 10:
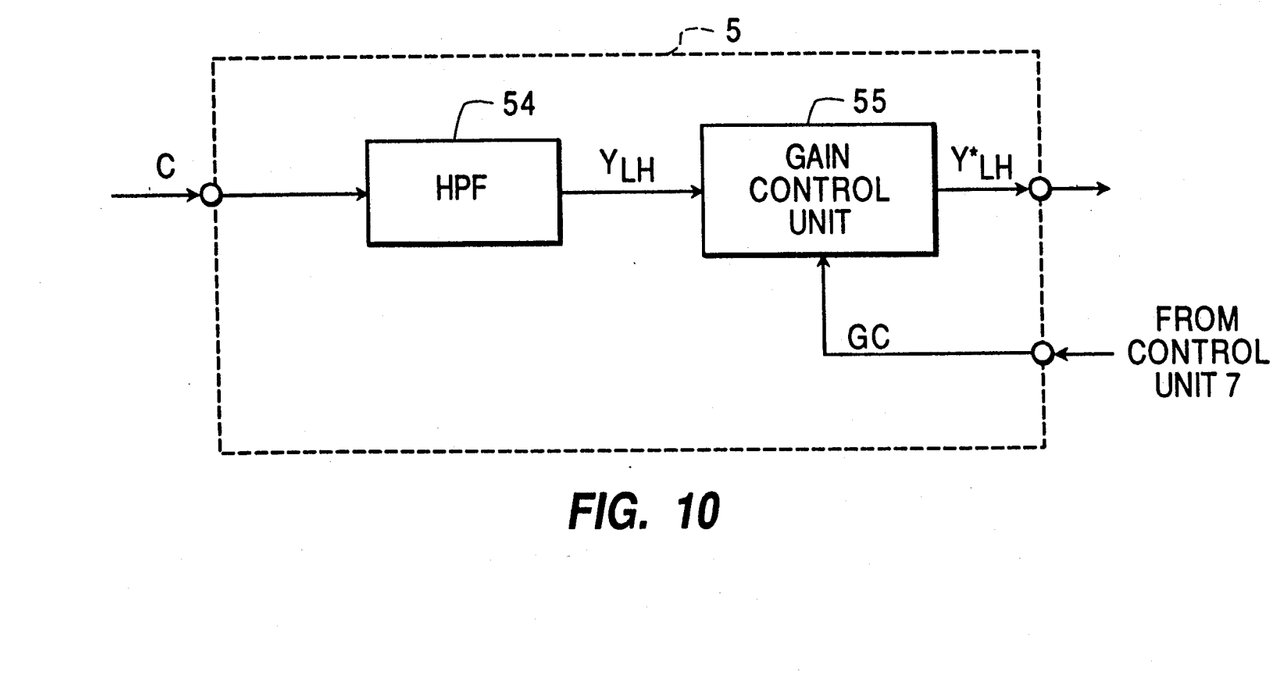
FIG. 10 is a block diagram showing a second concrete structure of a pre-process unit which is a component of a video camera according to an embodiment of this invention.

Next, a second example of a pre-process unit of a video camera of this invention will be explained below. FIG. 10 is a block diagram showing the structure of a pre-process unit of this second example. What is different from that explained in the first example shown in FIG. 9 is the absence of the LPF 48 and the first gain control unit 49 shown in FIG. 9. However, a high-pass filter (HPF) 54 and a gain control unit 55 in the second example are similarly structured to the HPF 50 and the second gain control unit 51 in the first example, respectively. Also, a gain control signal GC shown in FIG. 10 corresponds to the second gain control signal GC2 in the first example.

A video signal C outputted from the video camera process circuit 4 is inputted to the HPF 54 within the pre-process unit 5. The cutoff frequency of the HPF 54 is set at a frequency of 0.3 MHz for the same reason as explained in the first example. A luminance signal $Y_{LH}$ passed through the HPF 54 is controlled through the gain control unit 55 receiving the gain control signal GC outputted from the control unit 7 so that the output level thereof can be made constant. The signal thus controlled is outputted as an output signal $Y^*_{LH}$.

Even in the pre-process unit as structured as above, unnecessary low frequency components of a luminance signal, i. e., frequency components having a frequency below 0.3 MHz, are eliminated, and the change in the luminance of an object or the variation in the level of a luminance signal corresponding to the change in the contract thereof is suppressed, thus being capable of obtaining a video signal regulated at constant level.

In case of the second example of a pre-process unit of this invention, it is simpler in structure than that of the first example, but it is necessary to make the input dynamic range for the video signal C large (as a result, to make the gain control range, large too). This is because the pre-process unit of the second example has no gain control function (particularly for the luminance) of an input signal by the LPF and the first gain control unit as in the case of the first example.

As explained in detail as above, the pre-process unit provided in a video camera of this invention largely suppresses the level variation of a luminance signal due to the change in the contrast of an object so that the dynamic range of the signal processing unit at the next stage can be largely reduced, thus making the structure thereof simple.

What is claimed is:

1. A video camera with automatic focusing function comprising:
a taking lens for image-forming an image of an object, said taking lens including a focusing lens;

a photo-electric converting means for converting an image formed through said taking lens into an electrical signal;

a pre-process means comprising a high-pass filter for eliminating a direct current component from an output signal of said photo-electric converting means, and a gain control means for detecting a maximum value of an amplitude level of an output signal of said high-pass filter in a signal extracting range to be set at a specific area of an image plane and for either amplifying or compressing the output signal of said high-pass filter so as to maintain the maximum value thus detected at a constant level;

a signal processing means comprising a filter means for extracting a high frequency component having a frequency exceeding a specific frequency from an output signal of said pre-process means, and a detecting means for generating a focus signal corresponding to an amplitude level of the high frequency component thus extracted;

a lens driving means for driving said focusing lens of said taking lens; and a control means for controlling said lens driving means in accordance with said focus signal.

2. A video camera as claimed in claim 1, wherein a cutoff frequency of side high-pass filter is set at a frequency of at least 0.1 MHz.

3. A video camera comprising:

a taking lens for image-forming an image of an object, said taking lens including a focusing lens;

a photo-electric converting means for converting an image formed through said taking lens into an electrical signal;

a pre-process means for processing an output signal of said photo-electric converting means so as to eliminate therefrom a direct current component and to make an amplitude of the direct current component eliminated signal at a constant level;

a signal processing means for extracting a high frequency component having a frequency exceeding a specific frequency from an output signal of said pre-process means and generating a focus signal corresponding to an amplitude level of the high frequency component thus extracted;

a lens driving means for driving said focusing lens of said taking lens; and a control means for controlling said lens driving means in accordance with said focus signal;

wherein said pre-process means comprises;

a low-pass filter for eliminating a signal component having a frequency exceeding a specific frequency from the output signal of said photo-electric converting a first gain control means for detecting a maximum value of an output signal of said low-pass filter in a signal extracting range and for either amplifying or compressing the output signal of said low-pass filter so as to maintain the maximum value thus detected at a constant level;

a high-pass filter for extracting only a signal having a frequency exceeding a specific frequency from an output signal of said first gain control means; and a second gain control means for detecting a maximum value of an output signal of said high-pass filter in said signal extracting range and for either amplifying or compressing the output signal of said high-pass filter so as to maintain the maximum value thus detected at a constant level.

4. A video camera as claimed in claim 3, wherein a cutoff frequency of said high-pass filter is set at a frequency of at least 0.1 MHz.

5. A video camera as claimed in claim 3, wherein a cutoff frequency of said low-pass filter is set at a frequency less than or equal to 4 MHz.

6. A video camera with automatic focusing function comprising:

a taking lens for image-forming an image of an object, said taking lens including a focusing lens;

a photo-electric converting means for converting an image formed through said taking lens into an electrical signal;

a pre-process means comprising a high-pass filter for eliminating a direct current component from an output signal of said photo-electric converting means, and a gain control means for detecting a maximum value of an amplitude level of an output signal of said high-pass filter in a signal extracting range to be set at a specific area of an image plane and for either amplifying or compressing the output signal of said high-pass filter so as to maintain the maximum value thus detected at a constant level;

a signal processing means comprising an analog-to-digital converting means for converting an output signal of said pre-process means into a digital signal, a filter means for extracting a high frequency component having a frequency which is higher than than a specific frequency from an output signal of said analog-to-digital converting means, and a detecting means for generating a focus signal corresponding to an amplitude level of the high frequency component thus extracted;

a lens driving means for driving said focusing lens of said taking lens; and a control means for controlling said lens driving means in accordance with said focus signal.

* * * * *